(12) United States Patent
Manthe et al.

(10) Patent No.: US 12,178,021 B2
(45) Date of Patent: Dec. 24, 2024

(54) WELDING-TYPE POWER SUPPLIES WITH EXPANDABLE THERMAL INTERFACES

(71) Applicant: ILLINOIS TOOL WORKS INC., Glenview, IL (US)

(72) Inventors: Alan Adam Manthe, New London, WI (US); Nicholas James Dessart, Neenah, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 43 days.

(21) Appl. No.: 18/201,268

(22) Filed: May 24, 2023

(65) Prior Publication Data

US 2023/0301041 A1 Sep. 21, 2023

Related U.S. Application Data

(63) Continuation of application No. 17/545,123, filed on Dec. 8, 2021, now Pat. No. 11,729,955, which is a continuation of application No. 16/858,851, filed on Apr. 27, 2020, now Pat. No. 11,229,146.

(51) Int. Cl.
*H05K 7/20* (2006.01)
*B23K 9/10* (2006.01)
*B23K 26/70* (2014.01)
*B23K 37/00* (2006.01)
*H01L 23/367* (2006.01)
*H01L 23/40* (2006.01)

(52) U.S. Cl.
CPC ........... *H05K 7/209* (2013.01); *B23K 9/1043* (2013.01); *B23K 26/703* (2015.10); *B23K 37/003* (2013.01); *H05K 7/20918* (2013.01); *H01L 23/3672* (2013.01); *H01L 23/4093* (2013.01); *H05K 7/20163* (2013.01); *H05K 7/2039* (2013.01); *H05K 7/20418* (2013.01)

(58) Field of Classification Search
CPC ............ H05K 7/20163; H05K 7/2039; H05K 7/20418; H05K 7/209–20918; H01L 23/36–4735; B23K 26/703; B23K 37/003; B23K 9/1043
See application file for complete search history.

(56) References Cited

U.S. PATENT DOCUMENTS

| | | |
|---|---|---|
| 6,803,541 B2 | 10/2004 | Andersen et al. |
| 9,831,632 B2 | 11/2017 | Horn et al. |
| 10,046,411 B2 | 8/2018 | Dessart et al. |
| 2014/0069906 A1 | 3/2014 | Dessart et al. |

FOREIGN PATENT DOCUMENTS

JP H0899182 A * 4/1996

* cited by examiner

*Primary Examiner* — Zachary Pape
(74) *Attorney, Agent, or Firm* — McAndrews, Held & Malloy, Ltd.

(57) ABSTRACT

Systems and methods are disclosed relating to welding-type power supplies. In some examples, the power supplies may have no vents, which may help prevent environmental contaminants from entering the power supplies. Instead, the power supplies include one or more thermal interfaces configured to conduct heat generated by internal circuitry of the power supply from the interior of the power supply to an exterior of the power supply. Additionally, the thermal interface(s) may be configured for attachment to one or more exterior heat dissipating devices.

20 Claims, 7 Drawing Sheets

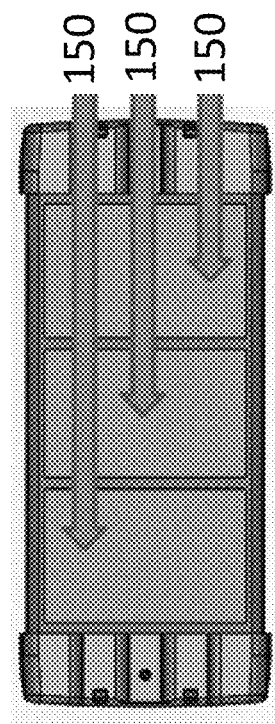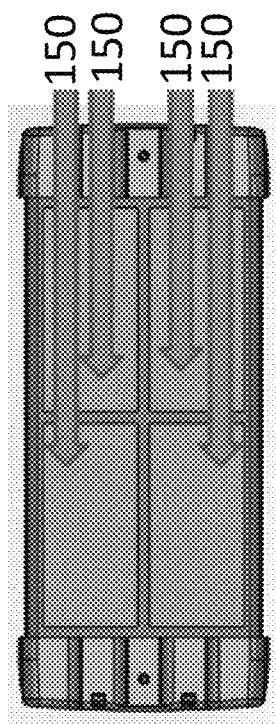
FIG. 2a
FIG. 2b

WELDING-TYPE POWER SUPPLIES WITH EXPANDABLE THERMAL INTERFACES

CROSS REFERENCE TO RELATED APPLICATIONS

This application is a continuation of, and claims priority to, U.S. patent application Ser. No. 17/545,123, filed Dec. 8, 2021, entitled "WELDING-TYPE POWER SUPPLIES WITH EXPANDABLE THERMAL INTERFACES," which is a continuation of, and claims priority to, U.S. patent application Ser. No. 16/858,851 (now U.S. Pat. No. 11,229,146), filed Apr. 27, 2020, entitled "WELDING-TYPE POWER SUPPLIES WITH EXPANDABLE THERMAL INTERFACES," the entirety of which are hereby incorporated by reference.

TECHNICAL FIELD

This disclosure relates to welding-type power supplies and, more particularly, welding-type power supplies with expandable thermal interfaces.

BACKGROUND

Conventional welding-type power supplies provide welding-type power to tools, such as, for example, welding torches. The internal circuitry of the power supplies generate thermal waste (i.e., heat) that must be managed. Conventional welding-type power supplies manage the heat via vented enclosures that allow in outside air to cool the internal circuitry, as well as fans to move the air over the internal circuitry.

SUMMARY

Welding-type power supplies with expandable thermal interfaces are disclosed, substantially as illustrated by and described in connection with at least one of the figures, as set forth more completely in the claims.

These and other advantages, aspects, and/or novel features of the present disclosure, as well as details of an illustrated example thereof, will be more fully understood from the following description and drawings.

DRAWINGS

Features, aspects, and/or advantages of the present disclosure will become better understood when the following detailed description is read with reference to the accompanying drawings in which like characters represent like parts throughout the drawings, wherein:

FIGS. 2a-2b are bottom views of alternative example welding-type power supplies, in accordance with aspects of this disclosure.

Figure 1A:
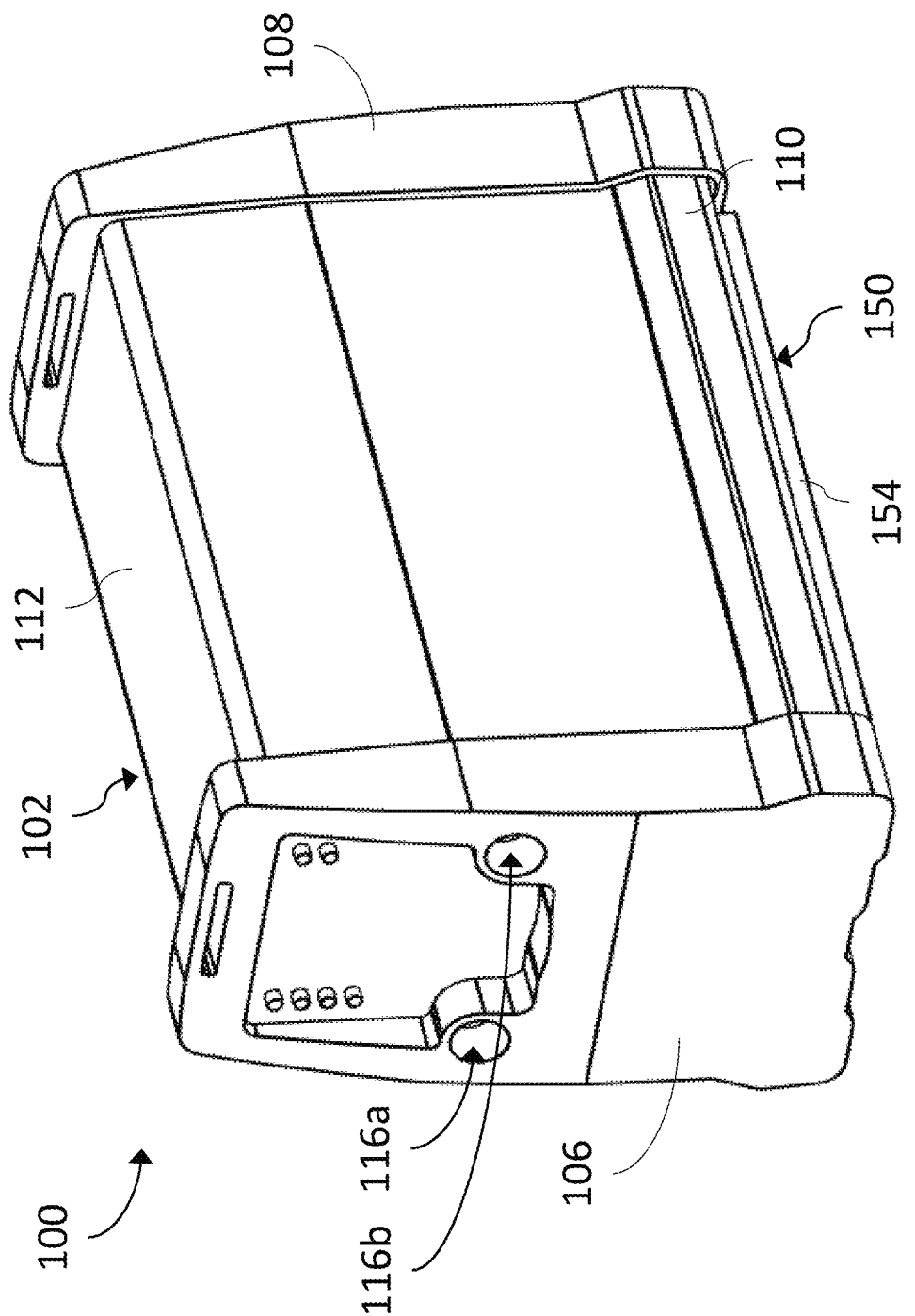
FIG. 1a shows a perspective view of an example welding-type power supply with an expandable thermal interface, in accordance with aspects of this disclosure.

The figures are not necessarily to scale. Where appropriate, similar or identical reference numbers are used to refer to similar or identical components. For example, reference numerals utilizing lettering (e.g., terminal 116a, terminal 116b) refer to instances of the same reference numeral that does not have the lettering (e.g., terminals 116).

DETAILED DESCRIPTION

While conventional welding-type power supplies use air circulating through vented enclosures to help cool the internal circuitry, these vents also allow in environmental contaminants, such as, for example, dust, debris, humidity, and/or water, along with the cooling air. Fans that move air over the internal circuitry may simultaneously direct the environmental contaminants to the internal circuitry. This can cause damage and/or other operational issues with the internal circuitry of the welding-type power supply.

The welding-type power supplies disclosed herein have no vents or other openings configured to allow air to pass into and/or out of the enclosure. The power supplies also have no internal fans and/or other internal air moving apparatus. Instead, disclosed example power supplies include a thermal interface configured to conduct heat from the internal circuitry of the power supply to an exterior of the power supply.

In some examples, the thermal interface may comprise and/or be configured to connect to a heat dissipating device. A heat dissipating device may comprise an apparatus, mechanism, device, and/or method for cooling and/or dissipation of heat, such as, for example a heat sink, a heat sink tunnel, a fan, a heat exchanger, and/or a liquid cooling system. In some examples, each heat dissipating device may be configured to attach to one or more other heat dissipating device. In this way, the power supply may be coupled to an heat dissipation system that can be expanded or reduced depending on the desires of the owner and/or the thermal duty cycle of the power supply.

Unvented power supplies with expandable heat dissipation systems may be valuable where the internal circuitry of the power supply is very efficient, generating waste heat that is a fraction of what is generated by conventional power supplies. As ever more efficient switching devices and/or magnetics are developed, efficiency increases and waste heat may be continually reduced. A power supply with highly efficient circuitry may generate waste heat that is sufficiently small enough to be managed by a thermal interface, with or without a ventilation system.

Some examples of the present disclosure may relate to a welding-type power supply, comprising power conversion circuitry configured to convert input power to welding-type output power; an enclosure housing the power conversion circuitry; and a thermal interface in thermal communication with the power conversion circuitry, the thermal interface comprising a thermally conductive material configured to conduct heat generated by the power conversion circuitry to an exterior surface outside of the enclosure.

Some examples of the present disclosure relate to a welding-type system, comprising a welding-type power supply, comprising power conversion circuitry configured to convert input power to welding-type output power, and an enclosure housing the power conversion circuitry; and a thermal interface in thermal communication with the power conversion circuitry, the thermal interface comprising a thermally conductive material configured to conduct heat generated by the power conversion circuitry to an exterior surface outside of the enclosure.

In some examples, the thermal interface comprises a heat sink or heat exchanger plate. In some examples, the thermal interface comprises a thermally conductive and electrically non-conductive material. In some examples, the enclosure has no vents. In some examples, the welding power supply includes no fans disposed within the enclosure. In some examples, the enclosure comprises a first sidewall, a second sidewall, a first end wall, a second end wall, a top wall, and a bottom wall, and one or more of the first sidewall, second sidewall, first end wall, second end wall, top wall, or bottom wall comprises the thermal interface.

In some examples, the thermal interface includes an interior surface within the enclosure and the exterior surface outside the enclosure. In some examples, the exterior surface of the thermal interface is configured to couple to a heat dissipater. In some examples, the heat dissipater comprises a fan, a heat sink, a heat sink tunnel, a heat exchanger, or a liquid cooling system. In some examples, the heat dissipater comprises a first heat dissipater, and the first heat dissipater is configured to couple to a second heat dissipater.

Figure 1B:
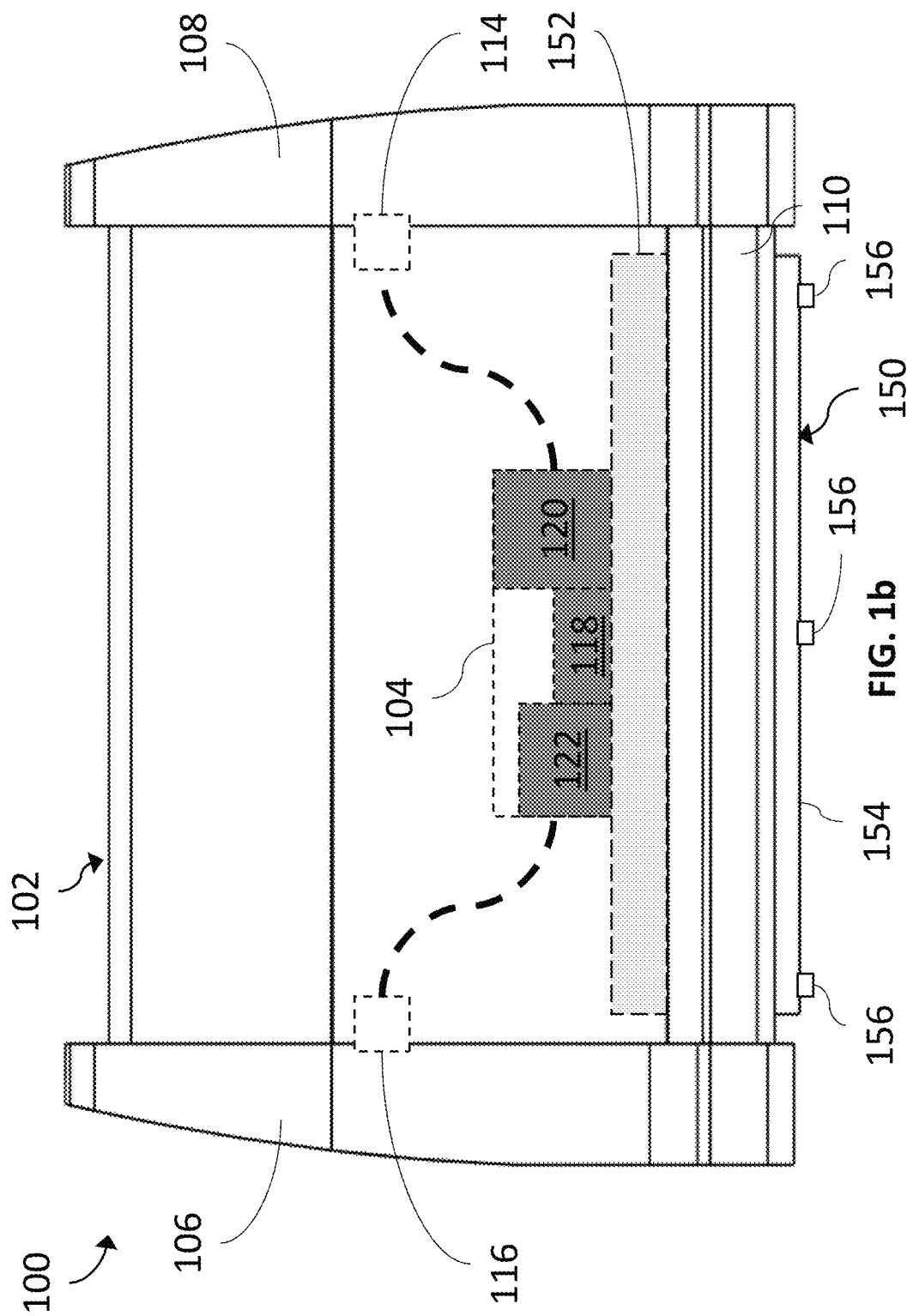
FIG. 1B shows a side view of the example welding-type power supply of FIG. 1a, along with certain internal components, in accordance with aspects of this disclosure.
Figure 1C:
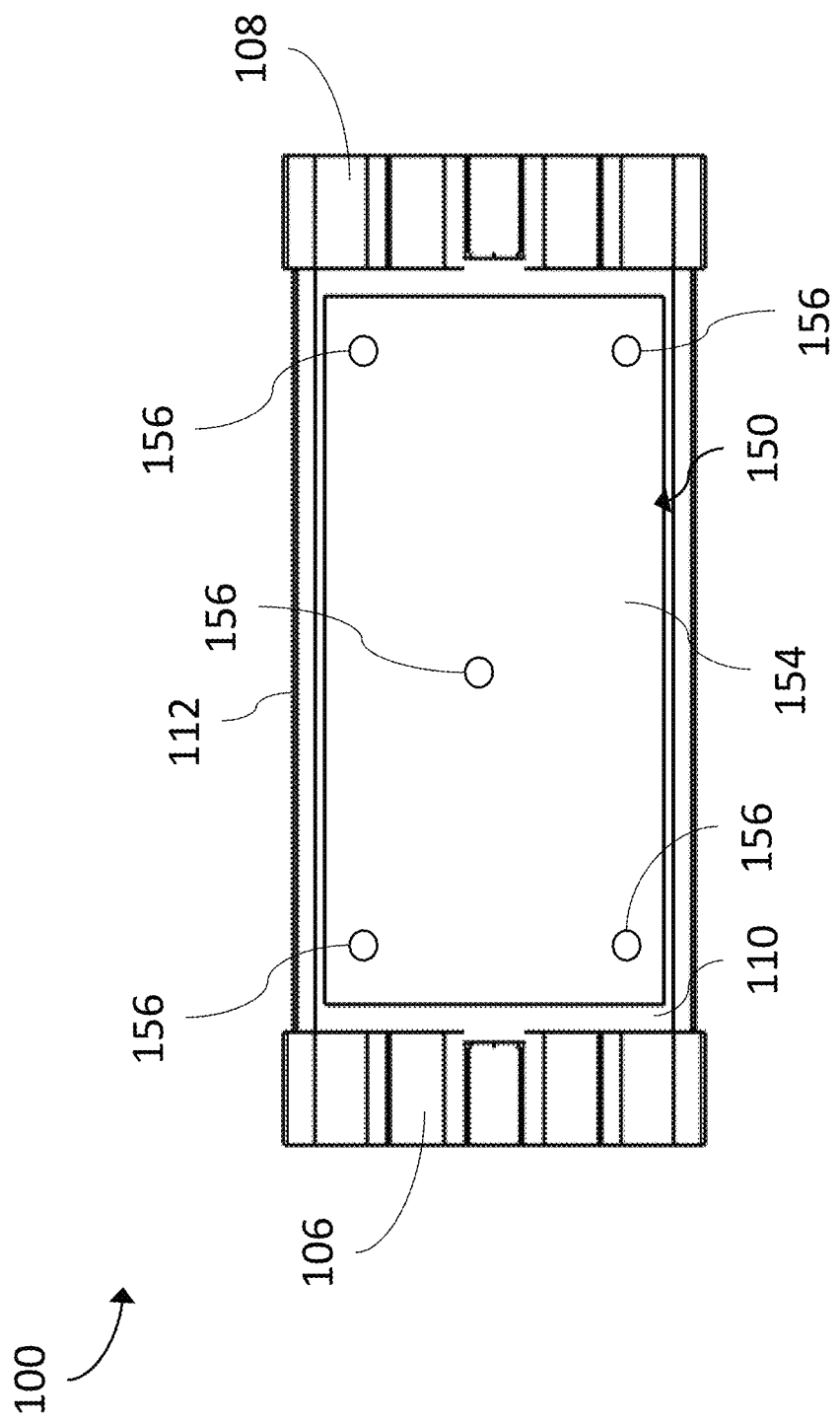
FIG. 1c is a bottom view of the example welding-type power supply of FIG. 1a, in accordance with aspects of this disclosure

FIGS. 1a-1c shows an example of a welding-type power supply 100. As shown, the power supply 100 includes an enclosure 102 that houses power conversion circuitry 104. The enclosure 102 includes a front panel 106, a rear panel 108, and a base 110 connected to the front panel 106 and rear panel 108. As shown, the enclosure 102 further includes a U shaped wrapper 112 (comprising two sidewalls and a roof) that connects to the base 110, front panel 106, and rear panel 108.

In the examples of FIGS. 1a-1c, the enclosure 102 includes no vents and houses no internal fans. In some examples, the enclosure 102 may be hermetically sealed. In some examples, the enclosure 102 may be configured to qualify for an Ingress Protection (IP) rating of 23 or higher. In some examples, the enclosure 102 may be configured to qualify for an Ingress Protection (IP) rating of 31 or higher.

FIG. 1B shows the power conversion circuitry 104 housed by the enclosure 102. As shown, the power conversion circuitry 104 is in electrical communication with a rear terminal 114 of the rear panel 108 and one or more front terminals 116 of the front panel 106. While only one front terminal 116 is shown in the example of FIG. 1B due to the side perspective of the figure, in some examples, the power conversion circuitry 104 may be in electrical communication with more than one front terminal 116.

In the example of FIG. 1a, the front panel 106 has two front terminals 116. In some examples, front terminal 106a may be configured to output auxiliary power. Auxiliary power may be used to power devices that use conventional power, such as, for example, phones, lights, external fans, and/or other devices. In some examples, front terminal 106b may be configured to output welding-type power that is used by welding-type tools (e.g., a welding torch). In some examples, the front terminal 116b may be connected to welding-type equipment, such as, for example, a wire feeder, instead of a welding-type tool.

In some examples, the rear terminal 114 may be configured to receive input power, such as, for example, from a mains power source. In some examples, the rear terminal may configured for connection with a power cable that routes electrical input power from the input power source to the rear terminal 114. In some examples, the power conversion circuitry 104 and/or rear terminal 114 may instead receive input power from some other source, such as, for example, a generator.

In some examples, the power conversion circuitry 104 is configured to convert input power (e.g., received via rear terminal 114) to welding-type output power that can be routed to welding-type equipment and/or a welding-type tool via the front terminal 116b. In some examples, the welding-type output power may be on the order of one or more Kilowatts of electrical power and/or hundreds of amps of electrical current. In some examples, the high levels of electrical power may necessitate precautions be taken. For example, the power supply 100 may include a reinforced boundary between the internal power conversion circuitry and external user accessible surfaces. In some examples, the power supply 100 may be configured to adhere to strict electrical isolation standards, such as set forth, for example, in the International Elecrotechnical Commission (IEC) 60974-1 standards.

In some examples, the power conversion circuitry 104 may additionally, or alternatively, output auxiliary power to the front terminal 116a. In the example of FIG. 1B, the power conversion circuitry 104 includes power semiconductors 118, such as, for example, various transistors and/or diodes. As shown, the power conversion circuitry 104 further includes various magnetic components 120, such as, for example, inductors and/or transformers. In the example of FIG. 1, the power conversion circuitry 104 additionally includes discrete components 122, such as, for example, capacitors and/or resistors.

While shown as separate portions of the power conversion circuitry 104 in the example of FIG. 1, in some examples, the power semiconductors 118, magnetic components 120, and/or discrete components 122 may be intermixed to form various electrical components (e.g., rectifiers, boost circuits, buck circuits, inverters, etc.) of the power conversion circuitry 104. In some examples, the various electrical components of the power conversion circuitry 104 may comprise one or more circuit boards. In some examples, the power semiconductors 118, magnetic components 120, and/or discrete components 122 of the power conversion circuitry 104 may generate waste heat that must be managed by the power supply 100.

In the example of FIG. 1B, the power conversion circuitry 104 is in thermal communication with an internal surface 152 of a thermal interface 150. In some examples, one or more thermally conductive potting compounds and/or packets may be used as intermediaries to place some or all of the power conversion circuitry 104 in thermal communication with the thermal interface 150. In some examples, some or all of the power conversion circuitry 104 may be physically attached to the thermal interface 150. For example, some or all of the power conversion circuitry 104 may be coupled to the thermal interface 150 via thermally conductive adhesive and/or other bonding material. As another example, some or all of the power conversion circuitry 104 may be attached to the thermal interface 150 via bolts, screws, and/or other fasteners.

In some examples, the cores of the magnetic components 120 may be attached to thermal interface 150. In such an example, the power conversion circuitry 104 may be designed to skew the thermal energy losses of the magnetic components 120 into the core material (rather than windings) of the magnetic components 120. Attaching the cores of the magnetic components 120 to the thermal interface 150 may help to facilitate easy transfer of the thermal energy from the magnetic components 120 to the thermal interface 150.

In the example of FIG. 1B, the thermal interface 150 extends through an opening in the base 110, thereby providing an internal surface 152 within the enclosure 102 of the power supply 100, and an external surface 154 that is outside of the enclosure 102. In some examples, the thermal interface 150 may be part of the base 110. In some examples, the thermal interface 150 may its own component separate of the base 110. In some examples, the thermal interface may be part of, or extend through, the front panel 106, rear panel 108, and/or wrapper 112.

In some examples, the thermal interface 150 may be configured to conduct heat from its internal surface 152 to its external surface 154, where the heat may be discharged and/or dissipated into the ambient environment. In some examples, the thermal interface 150 may be thermally conductive and/or electrically insulating, so as to electrically isolate the power conversion circuitry 104 and prevent significant electrical charge from being conducted to the external surface 154. For example, the thermal interface 150 may be comprised of aluminum oxide, aluminum nitride, and/or Mylar materials (e.g., PET plastic). In some examples, the thermal interface 150 may comprise a heat sink and/or heat exchanger plate.

While the thermal interface 150 is pictured as a single plate in the examples of FIG. 1a-1c, in some examples, there may be multiple thermal interfaces 150, such as shown, for example in FIGS. 2a-2b. FIG. 2a shows a welding-type power supply 200a with three thermal interfaces 150 extending through the base 110 of the power supply 200a. As shown, all three thermal interfaces 150 extend the width of the base 110, from sidewall to sidewall. FIG. 2b shows a welding-type power supply 200b with four thermal interfaces 150 extending through the base 110. In FIG. 2b, the thermal interfaces 150 are arranged with each of the four thermal interfaces 150 at a corner of the rectangular base 110. Other numbers and/or arrangements of thermal interfaces 150 may be used as well.

In some examples, the thermal interface 150 may be configured for attachment to one or more thermal dissipation devices 300 to help dissipate heat conducted through the thermal interface 150. In the examples of FIGS. 1b-1c, the external surface 154 of the thermal interface 150 includes couplers 156 configured to facilitate this attachment (the couplers 156 are omitted in FIGS. 2a-2b for clarity). While one particular arrangement of couplers 156 are shown in the examples of FIGS. 1b-1c, in some examples, the couplers 156 may be arranged differently.

FIGS. 3a-3d show examples of thermal dissipation devices 300. As shown, the thermal dissipation devices 300 include coupler complements 356 configured to interface with the couplers 156 of the thermal dissipation device 300. Connection of one or more couplers 156 with one or more coupler complements 356 may facilitate attachment of the thermal interface 150 to one or more thermal dissipation devices 300.

In some examples, the coupler complements 356 may also be configured for attachment to other complements 356, to enable thermal dissipation devices 300 to be attached to one another. In some examples, the couplers 156 and/or coupler complements 356 may comprise one or more apertures, projections, fasteners (e.g., nail, screw, bolt, hook/loop, etc.), adhesives, magnets, clasps, clips, brackets, hinges, buttons, and/or other appropriate attachment mechanisms. In some examples, the couplers 156 and/or coupler complements 356 may facilitate tool-less attachment and/or detachment. While particular arrangements of coupler complements 356 are shown in the examples of FIG. 3a-3d, in some examples, the coupler complements 356 may be arranged differently.

Figure 3B:
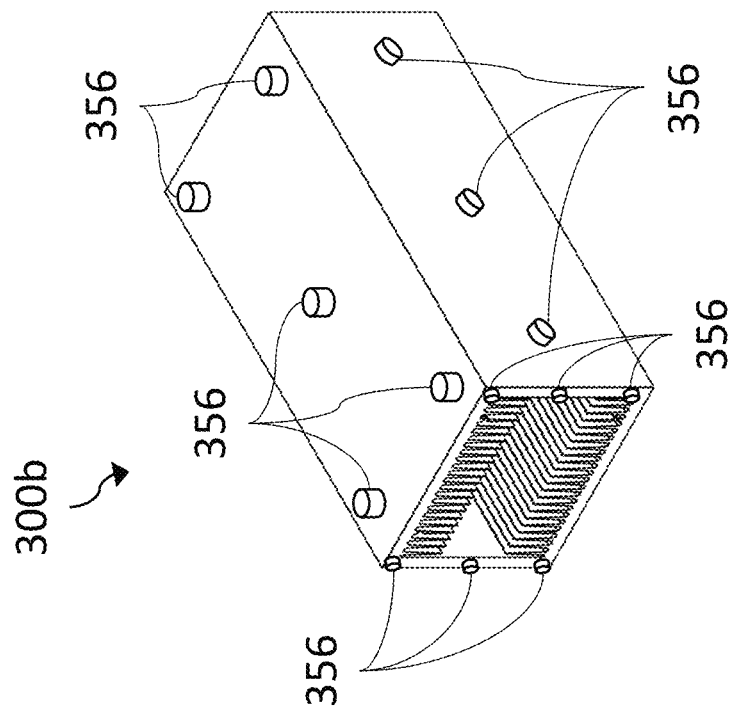
FIGS. 3a-3d are perspective views of different example thermal dissipating devices that could be coupled to the example welding-type power supply of FIG. 1, in accordance with aspects of this disclosure.
Figure 3A:
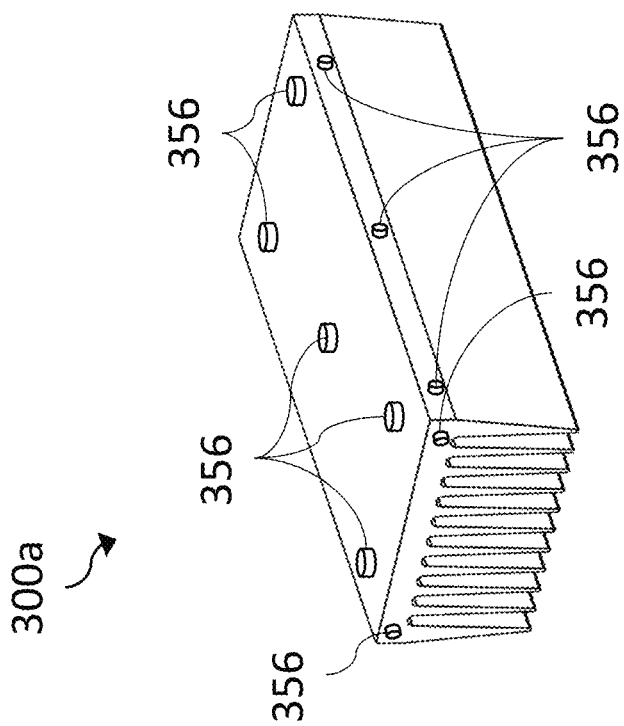

In the example of FIG. 3a, the thermal dissipation device 300a is a heat sink. The heat sink includes fins to assist with thermal dissipation. Coupler complements 356 are arranged on (and/or attached to) an upper surface, side surface, and end surface of the heat sink. Though not shown due to the perspective, in some examples, coupler complements 356 may also be arranged on a bottom surface, opposite side surface, and/or opposite end surface of the heat sink.

In the example of FIG. 3b, the thermal dissipation device 300b is a heat sink tunnel. Like the thermal dissipation device 300a, the heat sink tunnel has coupler complements 356 are arranged on (and/or attached to) an upper surface, side surface, and end surface (with other hidden surfaces potentially having coupler complements 356 as well). The heat sink tunnel also has a channel extending through its body, with fins extending into the channel.

Figure 3D:
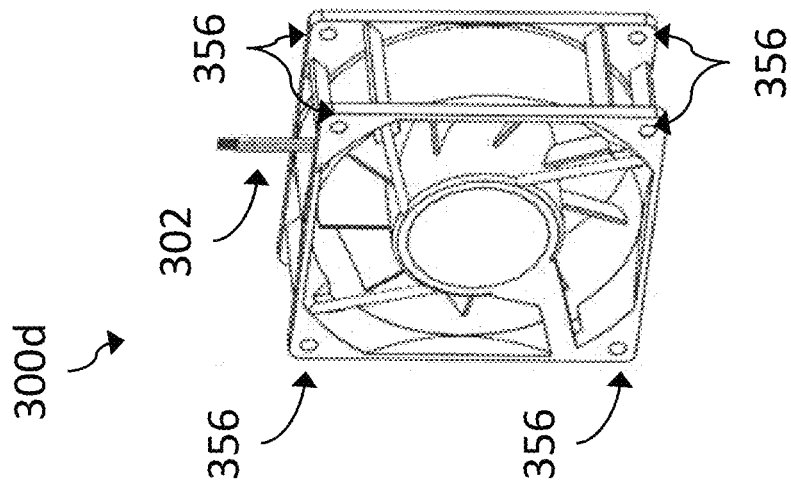
Figure 3C:
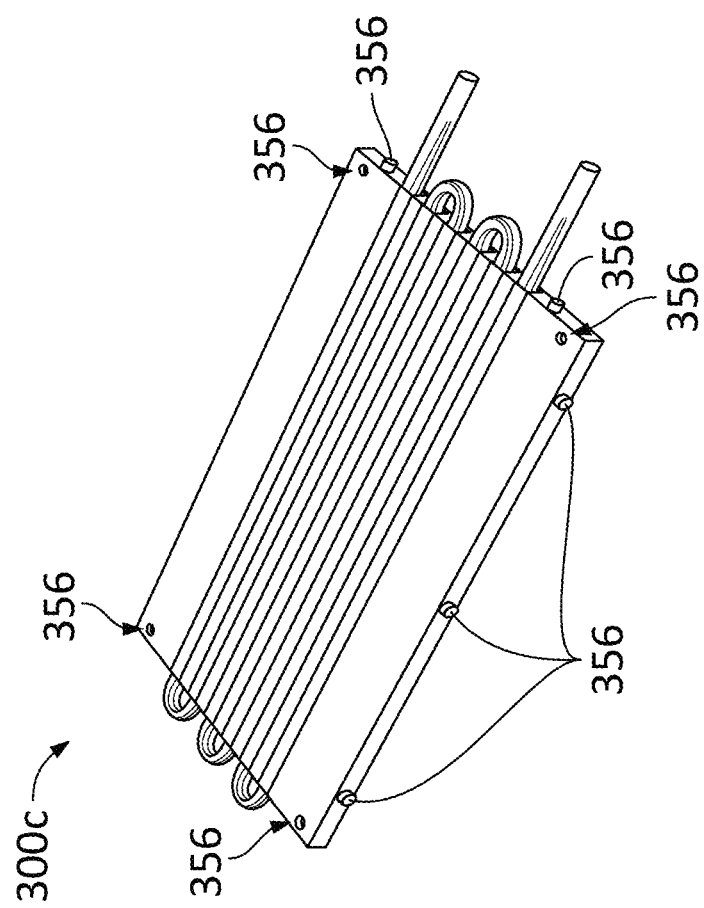

In the example of FIG. 3c, the thermal dissipation device 300c is a water cooled heat sink. Like the thermal dissipation device 300a, the water cooled heat sink has coupler complements 356 are arranged on (and/or attached to) an upper surface, side surface, and end surface (with other hidden surfaces potentially having coupler complements 356 as well). As shown, the water cooled heat sink has a pipe that winds through the heat sink. The pipe has an inlet and outlet configured for connection to a fluid pump and/or fluid collector. In some examples, the fluid may be water, liquid coolant, cooled (and/or compressed) air, and/or a cooling gas. In some examples, other fluid cooling systems may be used as well (e.g., a radiator).

In the example of FIG. 3d, the thermal dissipation device 300d is a fan. The fan has coupler complements 356 arranged on opposite end surfaces. The fan also has an electrical connector 302 configured for connection to a power source. In some examples, the electrical connector 302 may be connected to the front terminal 116a to receive auxiliary power from the power supply 100. While FIGS. 3a-3d show specific thermal dissipation devices 300, in some examples, other thermal dissipation devices 300 may be used.

Figure 4:
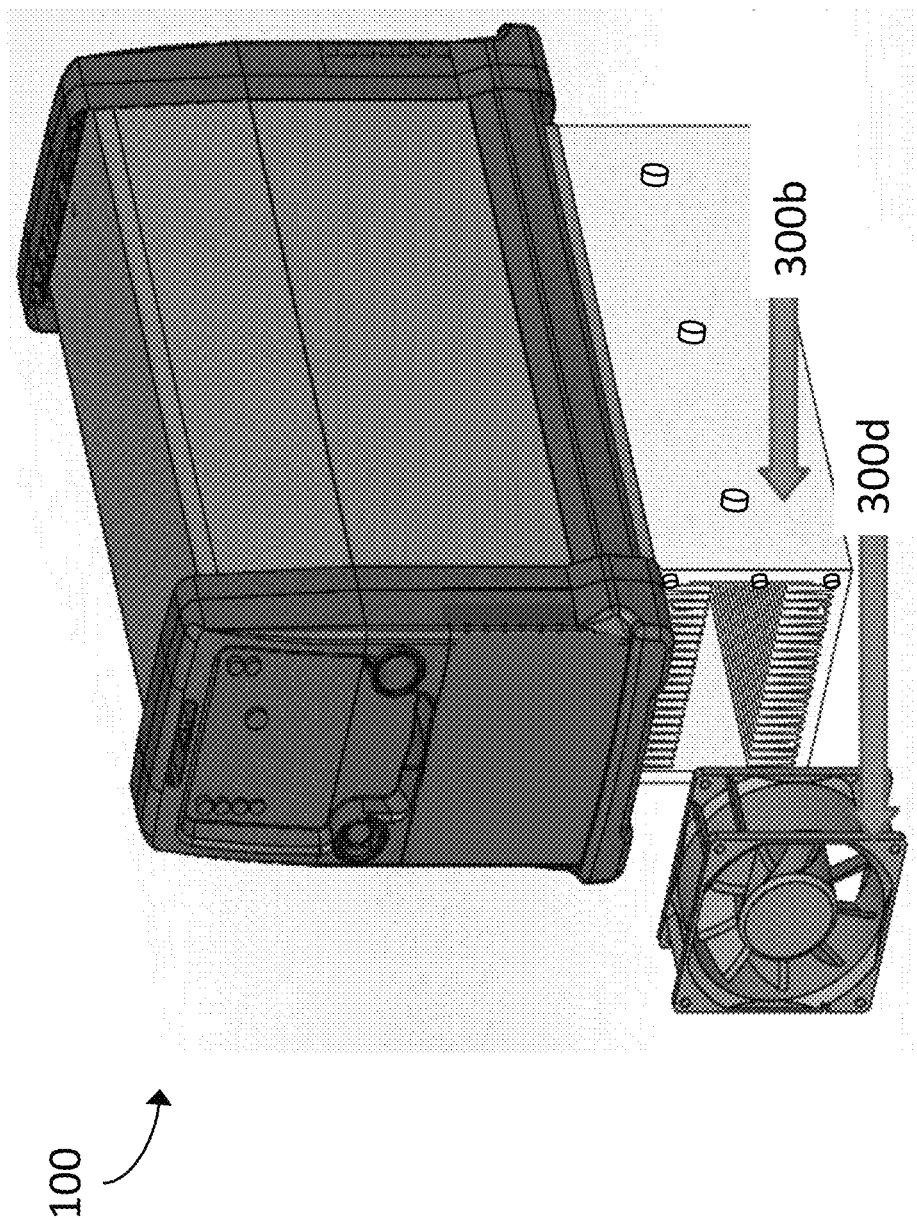
FIG. 4 is a perspective view of the example welding-type power supply of FIG. 1a attached to an example thermal dissipating device, in accordance with aspects of this disclosure.

FIG. 4 shows the thermal interface 150 attached to thermal dissipation device 300b. As shown, thermal dissipation device 300d is lined up for attachment to the thermal dissipation device 300b. By making the thermal dissipation devices 300 attachable to other thermal dissipation devices 300, heat management resources may be added and/or removed as needed.

The welding-type power supplies 100 disclosed herein have no vents or other openings configured to allow air to pass into and/or out of the enclosure 102. The power supplies 100 also have no internal fans and/or other internal air moving apparatus. The lack of vents and/or internal fans may help prevent environmental contaminants from causing operational issues within the power supply 100. Instead, the power supplies 100 include one or more thermal interfaces 150 configured to conduct heat from the internal power conversion circuitry 104 to an exterior of the power supply 100.

While disclosed examples enable omission of vents for cooling purposes, in some examples, vents and/or other types of apertures may be included to enhance cooling performance, permit access to the interior of the enclosure, and/or for any other reason. Additionally, the thermal interface 150 may be configured for attachment to one or more heat dissipating devices 300 which may further assist in heat dissipation. Through the use of the thermal interface 150 and/or heat dissipating devices 300, the power supply 100 is still able to dissipate the heat produced by the power conversion circuitry 104, with or without using vents and/or internal fans.

As used herein, a "vent" is an opening configured to allow air to pass out of or into an enclosure for the purposes of cooling.

As used herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z".

As used herein, the terms "approximate" and/or "approximately," when used to modify or describe a value (or range of values), position, shape, orientation, and/or action, mean reasonably close to that value, range of values, position, shape, orientation, and/or action. Thus, the examples described herein are not limited to only the recited values, ranges of values, positions, shapes, orientations, and/or actions but rather should include reasonably workable deviations.

As utilized herein, the terms "e.g.," and "for example" set off lists of one or more non-limiting examples, instances, or illustrations.

As used herein, the terms "couple," "coupled," "attach," "attached," "connect," and/or "connected" refer to a structural and/or electrical affixing, joining, fasten, linking, and/or other securing.

As utilized herein the terms "circuits" and "circuitry" refer to physical electronic components (i.e. hardware) and/or any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, circuitry is "configured" to perform a function whenever the circuitry comprises the necessary hardware and code (if any is necessary) to perform the function, regardless of whether performance of the function is disabled or not enabled (e.g., by a user-configurable setting, factory trim, etc.).

As used herein, a control circuit may include digital and/or analog circuitry, discrete and/or integrated circuitry, microprocessors, DSPs, etc., software, hardware and/or firmware, located on one or more boards, that form part or all of a controller, and/or are used to control a welding process, and/or a device such as a power source or wire feeder.

As used herein, the term "processor" means processing devices, apparatus, programs, circuits, components, systems, and subsystems, whether implemented in hardware, tangibly embodied software, or both, and whether or not it is programmable. The term "processor" as used herein includes, but is not limited to, one or more computing devices, hardwired circuits, signal-modifying devices and systems, devices and machines for controlling systems, central processing units, programmable devices and systems, field-programmable gate arrays, application-specific integrated circuits, systems on a chip, systems comprising discrete elements and/or circuits, state machines, virtual machines, data processors, processing facilities, and combinations of any of the foregoing. The processor may be, for example, any type of general purpose microprocessor or microcontroller, a digital signal processing (DSP) processor, an application-specific integrated circuit (ASIC). The processor may be coupled to, and/or integrated with a memory device.

As used, herein, the term "memory" and/or "memory device" means computer hardware or circuitry to store information for use by a processor and/or other digital device. The memory and/or memory device can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), a computer-readable medium, or the like.

The term "power" is used throughout this specification for convenience, but also includes related measures such as energy, current, voltage, and enthalpy. For example, controlling "power" may involve controlling voltage, current, energy, and/or enthalpy, and/or controlling based on "power" may involve controlling based on voltage, current, energy, and/or enthalpy.

As used herein, welding-type power refers to power suitable for welding, cladding, brazing, plasma cutting, induction heating, CAC-A and/or hot wire welding/preheating (including laser welding and laser cladding), carbon arc cutting or gouging, and/or resistive preheating.

As used herein, a welding-type power supply and/or power source refers to any device capable of, when power is applied thereto, supplying welding, cladding, brazing, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

As used herein, a welding-type tool refers to any tool capable of performing a welding, cladding, brazing, plasma cutting, induction heating, carbon arc cutting or gouging and/or resistive preheating operation.

Disabling of circuitry, actuators, and/or other hardware may be done via hardware, software (including firmware), or a combination of hardware and software, and may include physical disconnection, de-energization, and/or a software control that restricts commands from being implemented to activate the circuitry, actuators, and/or other hardware. Similarly, enabling of circuitry, actuators, and/or other hardware may be done via hardware, software (including firmware), or a combination of hardware and software, using the same mechanisms used for disabling.

While the present method and/or system has been described with reference to certain implementations, it will be understood by those skilled in the art that various changes may be made and equivalents may be substituted without departing from the scope of the present method and/or system. For example, blocks and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply, comprising:
   power conversion circuitry configured to convert input power to output power suitable for welding, cladding, brazing, induction heating, plasma cutting, carbon arc cutting, gouging, hot wire preheating, or resistive preheating;
   an enclosure housing the power conversion circuitry, wherein the enclosure includes no vents; and
   a thermal interface in thermal communication with the power conversion circuitry, the thermal interface comprising a thermally conductive material configured to conduct heat generated by the power conversion circuitry to an exterior surface outside of the enclosure.

2. The welding-type power supply of claim 1, wherein the thermal interface comprises a heat sink or heat exchanger plate.

3. The welding-type power supply of claim 1, wherein the thermal interface comprises a thermally conductive and electrically non-conductive material.

4. The welding-type power supply of claim 1, wherein no fans are positioned within the enclosure.

5. The welding-type power supply of claim 1, wherein the thermal interface comprises a first thermal interface comprising a first thermally conductive material configured to conduct heat to a first exterior surface, and the welding-type power supply further comprises a second thermal interface in thermal communication with the power conversion circuitry, the second thermal interface comprising a second thermally conductive material configured to conduct heat generated by the power conversion circuitry to the first exterior surface, or a second exterior surface, outside of the enclosure.

6. The welding-type power supply of claim 1, wherein the enclosure comprises a first sidewall, a second sidewall, a first end wall, a second end wall, a top wall, and a bottom wall, and one or more of the first sidewall, second sidewall, first end wall, second end wall, top wall, or bottom wall comprises the thermal interface.

7. The welding-type power supply of claim 1, wherein the thermal interface includes an interior surface within the enclosure and the exterior surface outside the enclosure.

8. The welding-type power supply of claim 7, wherein the exterior surface of the thermal interface is configured to couple to a heat dissipater.

9. The welding-type power supply of claim 8, wherein the heat dissipater comprises a fan, a heat sink, a heat sink tunnel, a heat exchanger, or a liquid cooling system.

10. The welding-type power supply of claim 8, wherein the heat dissipater comprises a first heat dissipater, and the first heat dissipater is configured to couple to a second heat dissipater.

11. A welding-type system, comprising:
    a welding-type power supply, comprising:
       power conversion circuitry configured to convert input power to output power suitable for welding, cladding, brazing, induction heating, plasma cutting, carbon arc cutting, gouging, hot wire preheating, or resistive preheating, and
       an enclosure housing the power conversion circuitry, wherein the enclosure includes no vents; and
    a thermal interface in thermal communication with the power conversion circuitry, the thermal interface comprising a thermally conductive material configured to conduct heat generated by the power conversion circuitry to an exterior surface outside of the enclosure.

12. The system of claim 11, wherein the thermal interface comprises a heat sink or heat exchanger plate.

13. The system of claim 11, wherein the thermal interface comprises a thermally conductive and electrically non-conductive material.

14. The system of claim 11, wherein no fans are positioned within the enclosure.

15. The system of claim 11, wherein the thermal interface comprises a first thermal interface comprising a first thermally conductive material configured to conduct heat to a first exterior surface, and the welding-type power supply further comprises a second thermal interface in thermal communication with the power conversion circuitry, the second thermal interface comprising a second thermally conductive material configured to conduct heat generated by the power conversion circuitry to the first exterior surface, or a second exterior surface, outside of the enclosure.

16. The system of claim 11, wherein the enclosure comprises a first sidewall, a second sidewall, a first end wall, a second end wall, a top wall, and a bottom wall, and one or more of the first sidewall, second sidewall, first end wall, second end wall, top wall, or bottom wall comprises the thermal interface.

17. The system of claim 11, wherein the thermal interface includes an interior surface within the enclosure and the exterior surface outside the enclosure.

18. The system of claim 17, wherein the exterior surface of the thermal interface is configured to couple to a heat dissipater.

19. The system of claim 18, wherein the heat dissipater comprises a fan, a heat sink, a heat sink tunnel, a heat exchanger, or a liquid cooling system.

20. The system of claim 19, wherein the heat dissipater comprises a first heat dissipater, and the first heat dissipater is configured to couple to a second heat dissipater.

* * * * *